United States Patent [19]

Robb et al.

[11] Patent Number: 4,775,879

[45] Date of Patent: Oct. 4, 1988

[54] FET STRUCTURE ARRANGEMENT HAVING LOW ON RESISTANCE

[75] Inventors: Stephen P. Robb, Tempe; Lewis E. Terry, Phoenix, both of Ariz.

[73] Assignee: Motorola Inc., Schaumburg, Ill.

[21] Appl. No.: 27,366

[22] Filed: Mar. 18, 1987

[51] Int. Cl.[4] .................. H01L 29/78; H01L 27/02
[52] U.S. Cl. .................. 357/23.4; 357/23.8; 357/23.1; 357/41
[58] Field of Search .............. 357/23.4, 23.8, 38 T, 357/45, 38, 41, 23.1

[56] References Cited

U.S. PATENT DOCUMENTS

| 4,152,714 | 5/1979 | Hendrickson et al. | 357/23.8 |
| 4,532,534 | 7/1985 | Ford et al. | 357/23.8 |
| 4,586,072 | 4/1986 | Nakatani et al. | 357/36 |
| 4,630,084 | 12/1986 | Tihanyi | 357/23.4 |
| 4,672,407 | 6/1987 | Nakagawa et al. | 357/23.4 |

FOREIGN PATENT DOCUMENTS

| 0130508 | 1/1985 | European Pat. Off. | 357/23.4 |
| 61-168263 | 7/1986 | Japan | 357/23.8 |
| 2137811 | 10/1984 | United Kingdom | 357/23.8 |

OTHER PUBLICATIONS

*Power Integrated Circuits,* McGraw-Hill, Inc., 1986, by Paolo Antognetti, pp. 3.34–3.42.
*Electronic Engineering,* Feb. 1983, "Siliconix Undercuts Power Mosfet Industry", p. 15.

Primary Examiner—Martin H. Edlow
Assistant Examiner—Donald J. Featherstone
Attorney, Agent, or Firm—Joe E. Barbee

[57] ABSTRACT

A vertical field effect transistor is provided which has its sources arranged in a pattern to essentially eliminate inactive common drain area between the sources. The preferred arrangement is to use rectangular source areas to form columns and rows in the arrangement. Every other row is shifted so that a source in a shifted row is positioned between sources in an adjacent row. The rows are then spaced closer together thereby achieving the substantial elimination of inactive drain area. The elimination of inactive drain area results in low on resistance during the conductive state of the vertical field effect transistor.

7 Claims, 1 Drawing Sheet

FET STRUCTURE ARRANGEMENT HAVING LOW ON RESISTANCE

BACKGROUND OF THE INVENTION

This invention relates, in general, to vertical field effect transistors, and more particularly, relates to the structural arrangement of a vertical field effect transistor (FET) in order to achieve improved characteristics.

Vertical FETs are emerging as the preferred design of power transistors, particularly power FETs. In a vertical FET device the gate and source electrodes are on one surface of a semiconductor substrate and the drain electrode is on the opposite surface of the semiconductor substrate. The vertical FET device is a multi-celled structure having a given number of elementary cells connected in parallel in a semiconductor substrate. The multiple cells are arranged adjacent to each other and have a simple geometric form. These geometric forms refer to the source which is an enclosed source and wherein the geometries can be circles, squares, hexagons, etc. Even though there is no universal agreement on the optimum source geometry, it appears that hexagonal cells appear to have been the preferred geometric pattern.

The top surface of the semiconductor substrate which contains the gate and source electrodes, has at least two layers of interconnect metallization lines. The lower layer is typically polysilicon and forms the gate electrode while the upper layer, which can cover the entire top surface, is aluminum or an aluminum alloy and contacts the source regions individually. The reason the source regions are arranged in multiple cells is to provide maximum perimeter of the source areas. An important factor in FET devices is the on resistance of the FET device when it is in the conductive state. Therefore, it would be advantageous to have a power FET arrangement which would provide low on-resistance and make maximum use of the semiconductor surface area.

Accordingly, it is an object of the present invention to provide a vertical field effect transistor having a plurality of source areas which are arranged in a pattern to achieve a minimum of inactive drain area on the same surface of a semiconductor substrate as the source areas.

Another object of the present invention is to provide a field effect transistor which has reduced gate to drain capacitance.

Yet another object of the present invention is to provide a field effect transistor which has more active cells per unit area.

A further object of the present invention is to provide a vertical field effect transistor having low on resistance achieved through the arrangement of source areas.

Yet a further object of the present invention is to provide a power field effect transistor which has a greater channel width or perimeter per unit area of silicon thereby resulting in a field effect transistor having a greater gain.

SUMMARY OF THE INVENTION

The above and other objects and advantages of the present invention are achieved by providing a vertical field effect transistor semiconductor device having a plurality of source areas on one surface of a semiconductor substrate and a drain electrode on the opposite surface of the semiconductor substrate. The source areas are arranged to substantially eliminate inactive drain areas on the one surface of the semiconductor substrate. The source areas are substantially rectangular in shape and form columns and rows in the arrangement. Every other row is shifted so that a source in a shifted row is positioned between sources in an adjacent row and the rows are then spaced closer together thereby achieving the substantial elimination of inactive drain areas.

DETAILED DESCRIPTION OF THE DRAWINGS

A vertical field effect transistor (FET) typically consists of a multiplicity of source areas on the top surface of a semiconductor substrate. A gate electrode insulated from the semiconductor substrate usually spans the space between the source areas. The drain electrode for the field effect transistor is located on the opposite side or bottom side of the semiconductor substrate. The number of source areas can number into the thousands and are commonly referred to as cells.

Figure 1:
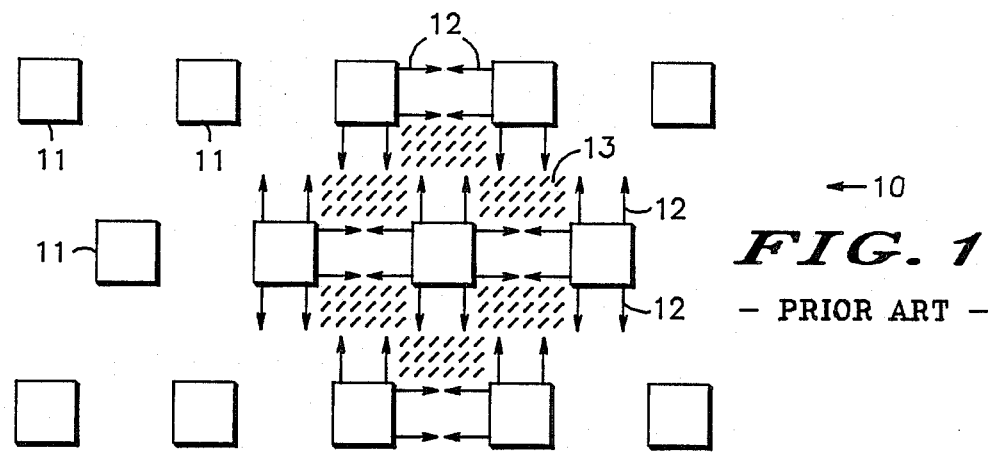
FIG. 1 illustrates a small number of source areas of a prior art vertical field effect transistor.

FIG. 1 illustrates a number of source cells arranged in a prior art configuration 10. The arrangement or configuration 10 is commonly called an "offset squares arrangement" since every other row of the arrangement is offset from an adjacent row so that the sources 11 of the offset row are aligned within the space between the sources of the adjacent row. The arrows 12, shown between a few of sources 11, illustrate current flow from sources 11. FIG. 1 is a plan view and therefore current arrows 12 are illustrated as flowing towards each other, then the current flows down into the figure towards the drain electrode which is not illustrated. The current flow between sources 11 and the drain is better illustrated in FIG. 3. Offset squares arrangement 10 is an attempt to make maximum utilization of silicon area. However, as can easily be seen in FIG. 1, there are dead zones or inactive areas 13 illustrated by hatched lines. Actually area 13 is not totally wasted because the surface accumulation layer acts to spread current into this area even though there is added resistance. A preferred arrangement would be to have uniform current flow in all the areas between sources 11, this would reduce the on resistance.

Figure 2:
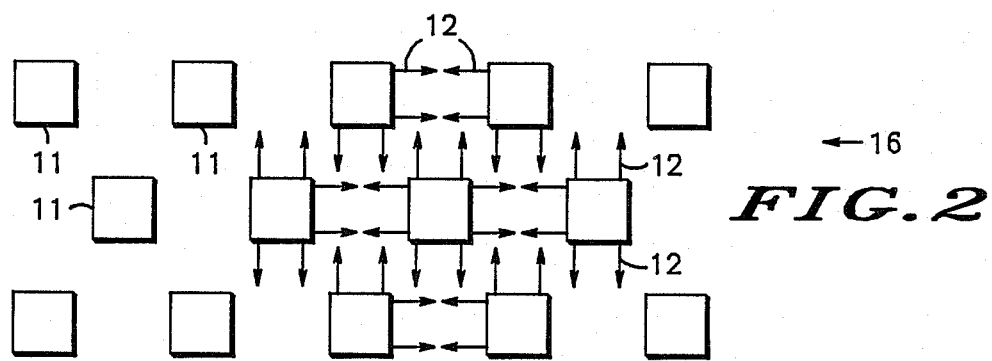
FIG. 2 illustrates a small number of source areas of a vertical field effect transistor embodying the present invention.

Source arrangement 16, illustrated in FIG. 2, eliminates inactive area 13. This arrangement is achieved by moving the non-offset rows closer to the offset rows so that all of the area between sources 11 is active area, as illustrated by arrows 12. In otherwords, every other row of sources 11 is offset so that the sources in the offset row appear between the spaces of the sources of the adjacent rows. In addition, all the rows are spaced closer together. In a preferred embodiment, the distance between sources in one direction is half the distance in the other direction. Although the preferred embodiment has been illustrated having square sources 11, a similar elimination of inactive area 13 can be achieved by extending the dimensions of the offset rows of sources (as shown in FIG. 1) in one direction only so that they would be longer in that direction while maintaining the same width. Typically, sources 11 have a hole in the center. As an example, a circular source would be donut shaped.

The arrangement in FIG. 2 can be called a "squished squares arrangement" since the distance between sources in one direction is half the distance as it is in the other direction. This arrangement can result in a 33 percent increase in channel width for a high voltage design FET and a 25 percent increase in channel width for a low voltage design FET. This results in a higher gain transistor while having lower gate to drain capacitance (Ciss) for a given die size. If source areas 11 are squished further together to where they overlap each other, then a high resistance will be formed in the overlapped region which may increase $r_{DS}$(on) of the resulting transistor.

If configuration 16 is rotated 90 degrees so that the rows become columns, the same benefits will result; however, in the description presented hereinbefore the term "row" would then have to be converted to "column".

In a normal square layout, wherein all the rows and columns are in line with each other, maximum channel width is achieved when the source width is equal to the distance between the sources. The squished square arrangement 16 is different since maximum channel width occurs when the source width is equal to the distance between the sources in the same row divided by the square root of 2, since the distance between the sources is half as wide in one direction as the other direction. When the distance between sources or source areas is narrow, e.g., for low voltages, the maximum channel width is very sensitive to variations of the source width. This illustrates why it is desirable to go to large numbers of cells per square inch for low voltage designs. It should be noted that the present invention is not limited to the distance between the sources being one-half the distance in one direction as in the other direction. The distance can be a third, a fourth, etc. The ratio of the distances will be determined by the desired operating voltage of the device. For a high voltage power FET, a greater distance is required while for a low voltage device, the rows can be squished closer together.

FIGS. 1 and 2 only show a few source areas in order to explain the present invention. In an actual vertical FET having thousands of sources, there would be a large number of rows and columns of sources.

Figure 3:
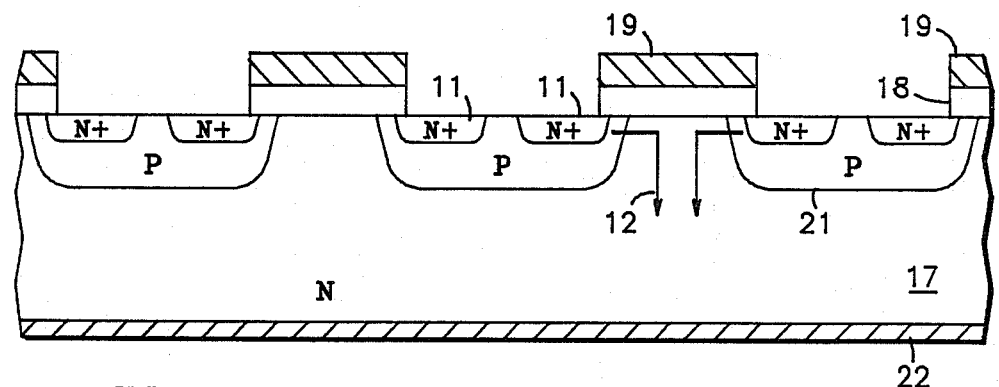
FIG. 3 illustrates, in schematic form, a cross-section of a small portion of a vertical field effect transistor which is useful in understanding the present invention.

FIG. 3 illustrates, in cross-sectional view, a portion of the device of FIG. 2. A semiconductor substrate 17, has extending from its top surface a plurality of P wells 21. Also extending from the top surface and contained within each P well 21 is a source 11. Source 11 is illustrated as being two portions within P well 21 since the cross-section, as illustrated in FIG. 3, is taken right through the center of the source area. Actually source 11 is in a square configuration, as illustrated in FIG. 2, having a center opening thereby making the cross-section of source 11 appear as two sources. The area between, as well as below, P well 21 is drain area with drain electrode 22 located on the bottom side of substrate 17. FIG. 3 shows more clearly how current flows from source areas 11 into a common drain area then vertically down to electrode 22. The current flow is illustrated by arrows 12. The channel for the vertical field effect transistor is formed between source 11 and the junction of the P well with a common drain area. An oxide 18 covers the channel as well as the common drain area for each cell. Dielectric or oxide 18 insulates gate electrode 19 from semiconductor substrate 17. Gate electrode 19 is typically a conductive material such as polysilicon or the like. It will be noted that semiconductor substrate 17 can actually comprise a semiconductor substrate near drain electrode 22 with an epitaxial layer covering the substrate and containing P wells 21. Also P wells 21 could have a different configuration to enhance breakdown voltage characteristics of the FET. Contact to source 11 is typically made by metal contacting sources 11 and P wells 21.

By now it should be appreciated that there has been provided a vertical field effect transistor having a source arrangement which essentially eliminates inactive common drain areas near the sources in a manner that results in lower on-resistance and more channel width per unit area of silicon. The increase in channel width results in increased gain of the vertical FET.

We claim:

1. A vertical field effect transistor having a plurality of source areas which are arranged in a pattern to achieve minimum inactive drain area, comprising: a semiconductor substrate having a first surface and a second surface; the plurality of source areas being substantially square in configuration and extending into the substrate from the first surface; a region surrounding each of the plurality of source areas and extending into the substrate a greater distance than the source areas; a common drain electrode in contact with the second surface; the plurality of source areas being arranged in rows and columns wherein every other row is offset from an adjacent row in order that a source in the offset row is aligned with a space provided between two source areas in the adjacent row and the distance between an offset row and an adjacent row is one-half the distance between source areas in the same row; and a gate electrode formed between adjacent source areas.

2. The vertical field effect transistor of claim 1 wherein the source areas have sides of the same length as the distance between adjacent source areas in the same row.

3. A vertical field effect transistor having a common drain and parallel connected sources and gates, the sources being arranged wherein distance between sources in a first direction is less than the distance between sources in a second direction to substantially leave no inactive drain area between the sources during operation of the vertical field effect transistor.

4. The vertical field effect transistor of claim 3 wherein the distance between the sources in the first direction is approximately one-half of the distance between the sources in the second direction.

5. The vertical field effect transistor of claim 3 wherein the sources are substantially square.

6. A vertical FET semiconductor device having a plurality of source areas on one surface of a semiconductor substrate and a drain electrode on the opposite surface of the semiconductor substrate, comprising an arrangement of the source areas to substantially eliminate inactive drain area on the one surface of the semiconductor substrate wherein the source areas are rectangular in shape and form columns and rows in the arrangement, wherein every other row is shifted so that a source in a shifted row is positioned between sources in an adjacent row, and the rows are then spaced closer together thereby achieving the substantial elimination of inactive drain area.

7. The vertical FET of claim 6 having its gate on the one surface.

* * * * *